United States Patent
Smith, Jr. et al.

(10) Patent No.: US 6,697,607 B1
(45) Date of Patent: Feb. 24, 2004

(54) AUTOMATIC RECEIVER CONTROL UPON INITIALIZATION

(75) Inventors: Newton James Smith, Jr., Austin, TX (US); Herman Rodriguez, Austin, TX (US); Clifford Jay Spinac, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 575 days.

(21) Appl. No.: 09/704,599

(22) Filed: Nov. 3, 2000

(51) Int. Cl.$^7$ ................................................ H04B 1/18
(52) U.S. Cl. .................. 455/185.1; 455/161.1; 455/181.1; 455/184.1; 348/731
(58) Field of Search ............................ 455/181.1, 185.1, 455/161.1, 166.2, 184.1, 186.1; 348/731, 732

(56) References Cited

U.S. PATENT DOCUMENTS

| | | | | |
|---|---|---|---|---|
| 3,593,148 A | * | 7/1971 | Cummings | 455/185.1 |
| 4,860,380 A | | 8/1989 | Mengel | 455/185 |
| 5,161,023 A | * | 11/1992 | Keenan | 455/161.1 |
| 6,112,064 A | * | 8/2000 | Arrowsmith et al. | 455/186.1 |

FOREIGN PATENT DOCUMENTS

| | | | | |
|---|---|---|---|---|
| JP | 8155038 | | 11/1996 | ............. H03J/5/02 |
| JP | 8336079 | | 12/1996 | ............. H04N/5/44 |
| JP | 11266406 A2 | | 9/1999 | ............. H04N/5/44 |
| WO | WO 94/24832 | * | 10/1994 | ............. H04Q/7/00 |

* cited by examiner

Primary Examiner—Lee Nguyen
(74) Attorney, Agent, or Firm—Robert H. Frantz; David A. Mims, Jr.

(57) ABSTRACT

A broadcast receiver such as a radio, television, or web browser, which automatically tunes to a preselected signal source upon initialization for a predetermined period of time. During this period of time, the user of the system may receive useful information or directions, such as directions to exit an airport or train station, instructions to orient a new user with a rental car or rental receiver, news, traffic reports, weather reports, instructions regarding hotel facilities or check-in and check-out procedures. In an enhanced form of the invention, the receiver may be automatically tuned to a series of signal sources on a timed basis. Upon conclusion of the predetermined time interval, the radio is optionally re-tuned to a user's preferred radio station or the last signal source which was tuned prior to shut off. The automatically tuned signal sources may include radio stations, television stations, cable television channels, Internet broadcast servers and channels, system memory, or recorded media such as Compact Disk or tape.

34 Claims, 3 Drawing Sheets

AUTOMATIC RECEIVER CONTROL UPON INITIALIZATION

INCORPORATION BY REFERENCE

The related application, Ser. No. 09/687,090, filed by Newton James Smith on Oct. 12, 2000, is incorporated herein by reference in its entirety, including drawings, and hereby is made a part of this application.

CROSS-REFERENCE TO RELATED APPLICATIONS CLAIMING BENEFIT UNDER 35 U.S.C. 120

This application is related to the U.S. application docket AUS9-2000-0531-US1 (to be amended to include serial number when it has been assigned) filed on Oct. 12, 2000 by Newton James Smith, et al, which is commonly assigned.

FEDERALLY SPONSORED RESEARCH AND DEVELOPMENT STATEMENT

This invention was not developed in conjunction with any Federally sponsored contract.

MICROFICHE APPENDIX

Not applicable.

BACKGROUND OF THE INVENTION

1. Field of the Invention

This invention relates to the art of receivers of broadcast signals and data, such as traditional analog radio receivers, digital radio receivers, televisions, and wired and wireless web receivers.

2. Description of the Related Art

There are many types of broadcast receivers available in the art today, including radios, televisions, and wireless web receivers. With the advent of Internet broadcast video and broadcast radio channels such as Net Channels and Net Radio by Netscape, even a web browser connected to a wired network can be considered a broadcast receiver of sorts. Thus, not all broadcast receivers are necessarily wireless receivers, but in general it can be said that all broadcast receivers are of the nature that they receive and present information to a user in a unidirectional manner.

Many broadcast technologies include information within the data stream, on a sub-carrier, or on a separate carrier, which can be decoded or demodulated to reveal information regarding the broadcast source, broadcast content or "format tag", and other information. One such available system in Europe is the Radio Data Service ("RDS"), and a similar system available in the United States is the Radio Broadcasting Data Service ("RBDS"). These systems include an inaudible carrier or subcarrier associated with the broadcast signal which contains information or data that can be demodulated and decoded to reveal information regarding the broadcast source and broadcast content (e.g. "format tag"). By decoding this information, a radio may display the call letters of the radio station to which it is tuned, the program format (e.g. classical, rock, news, jazz, talk, etc), or other useful information. Such radios are readily available from major manufacturers of radios such as Blaupunkt.

Standard chip set or semiconductor solutions for implementing these types of radio receivers are available from well-known semiconductor manufacturers, such as the Philips' Radio Data System Demodulator Chip SAA6579 and the RDS/RBDS preprocessor SAA6588.

Turning to FIG. 1, the general architecture of a prior art radio (1) is shown. A broadcast signal (10) is received by the radio (1) through an antenna (2). A tuner receiver (3) decodes a signal from a selected frequency and band, and outputs that signal to an audio amplifier (7). In turn, the audio amplifier (7) produces a signal to drive a speaker (8) which is audible by a user. Most modern radios are controlled by a controller (4), such as a microprocessor or micro controller, which may select a frequency and a band for the tuner receiver (3) to decode. Indicators from the tuner receiver (3) back to the controller may include station lock, stereo detected, and RDBS or RDS detected. The controller typically has associated with it a memory 4' for use by the firmware or software executed by the controller, and for storing user preferences such as the station assignments to preset keys on the radio.

A typical radio also has a keypad (5), which can be monitored by the controller for user input, and a display (6), such as an alphanumeric LCD display, which can be driven by the controller. On the keypad there are typical preset keys such as preset 1 through preset 5. A typical radio will allow a user to assign a specific frequency or station to each key pad preset key. For example, preset key 1 may be assigned to the favorite radio station of a user, such that the user may quickly tune the radio to the favorite station by a single press of preset key 1. The controller stores this selection in a list in memory (4'). Most radios display the frequency of the currently selected station, or the time from a clock on the display (6).

More advanced radios include an information channel decoder (9), such as an RDS or RBDS decoder. In these radios, certain information from the information channel decoder is available to the controller for use in its control of the tuner receiver, and possibly for display to the user. This may include displaying the radio station's call letters, a song title or artist name, or other information.

Many radios are provided with several preset keys in the keypad. They may also have a key that cycles through one or more banks of preset memories, such as three FM band preset banks and one AM band preset bank. For example with 5 preset keys, a user may configure the radio with up to fifteen favorite FM stations and five favorite AM stations. However, most users are unable to remember fifteen stations assigned to fifteen key selections, and thus the banks 2 and 3 may go practically unused.

Most rental cars are equipped with an AM/FM radio, and many have cassette or CD players also. When a rental car customer arrives in a new city at an airport or a train station, he typically rents the car from an agency and then takes the car from the airport or the train station into the city. Radios currently available in such rental vehicles are not easily reprogrammed or setup for the user for his preferences. In the related application, advanced methods for automatically configuring the radio preset keys were disclosed which enable a user, who is unfamiliar with a set of radio stations or broadcast stations in a geographic region, to quickly program his radio by broadcast content of the radio stations.

Further, the user typically is not familiar with the vehicle that he has rented because it might not be the same make or model of vehicle that he personally owns. And, he will often need detailed directions for exiting the airport, information regarding weather, traffic, and events in the city which he is visiting, and information on how to return the automobile. Some airports and train stations provide a low power radio transmitter which includes information about the local surroundings and directions around and in and out of the airport. However, since the new visitor is not aware of this radio station, he is not likely to tune his rental car radio to that station. An analogous situation occurs when a new visitor checks into a hotel. His room may have a television which is equipped with cable or satellite transmissions, but he may not be familiar with the various television stations or cable stations available to him in this particular city. Thus, in the related application, the methods disclosed can be used to tune his television based upon broadcast content of the locally available television stations or cable channels. Again, he may not easily obtain local information about events, weather, and information on how to use the facilities of the hotel easily using most televisions in common hotel rooms. While some hotel televisions do provide a function that upon being turned on they tune to a specific channel which gives directions on how to use the pay-per-view movies, possibly some news about events at the hotel, and maybe a cable channel guide, this informational channel will continue to be displayed until a user either turns off the television or changes the channel manually.

As these information receivers, such as radio receivers in rental cars, televisions in hotel rooms, and even web TV browsers in hotel rooms are very common place today, they represent an opportunity to provide accessible information and instructions to a user, but, as of yet, have not been effectively used as such.

Therefore, there is a need in the art for a system and method which automatically tunes a broadcast signal receiver such as a radio, television, or web browser to a preselected or series of preselected broadcast sources for a period of time upon initialization of the system, such as turning the power on to the radio, television, or web browser. By configuring the broadcast receiver to automatically tune to information or instructional channels, or to a series of informational or instructional channels upon power-up, the user may be automatically notified or instructed as to directions to exit an airport, directions to return a rental car, local news, weather, and traffic reports, instructions on how to use the system or the vehicle in which a receiver is installed, and instructions on how to find and use facilities within a hotel. The automatically tuned source may also contain advertising, which may enable new business models for hotels and rental car companies to provide targeted advertising to their clients. For example, products, services and establishments who cater to higher income clientele may be advertised in luxury rental cars, while products, services and establishments directed towards budget-minded patrons may be advertised in economy rental cars.

Further, there is a need in the art for this system and method of automatically temporarily tuning a broadcast receiver to allow for the selection of the source of informational and instructional material to come from a plurality of sources, such as a series or sequence of broadcast stations, internet channel sources or addresses, television stations, radio stations, system memory, or system recorded media such as tapes or CDs.

BRIEF DESCRIPTION OF THE DRAWINGS

The following detailed description when taken in conjunction with the figures presented herein provide a complete description of the invention.

SUMMARY OF THE INVENTION

The system and method disclosed herein allows a broadcast receiver such as a radio, television, or web browser, to automatically tune to a preselected signal source upon initialization for a predetermined period of time. During this period of time, the user of the system may receive useful information or directions, such as directions to exit an airport or train station, instructions to orient a new user with a rental car or rental receiver, news, traffic reports, weather reports, instructions regarding hotel facilities or check-in and check-out procedures. According to another aspect of the invention, the receiver may be automatically tuned to a series of signal sources on a timed basis. Upon conclusion of the predetermined time interval, the radio is optionally re-tuned to a user's preferred radio station or the last signal source which was tuned prior to shut off. The automatically tuned signal sources may include radio stations, television stations, cable television channels, Internet broadcast servers and channels, system memory, or recorded media such as Compact Disk or tape.

DETAILED DESCRIPTION OF THE INVENTION

The system and method are preferably realized as firmware functions in combination with a processor-controlled standard broadcast receiver. For example, Philips Semiconductors offers a radio chipset which is capable of receiving and decoding the European RDS and the United States RBDS channels from broadcast radio stations. They offer a self-tuning radio ("STR") chipset selection in the form of a micro controller, CPR120, which is firmware-based.

Figure 1:
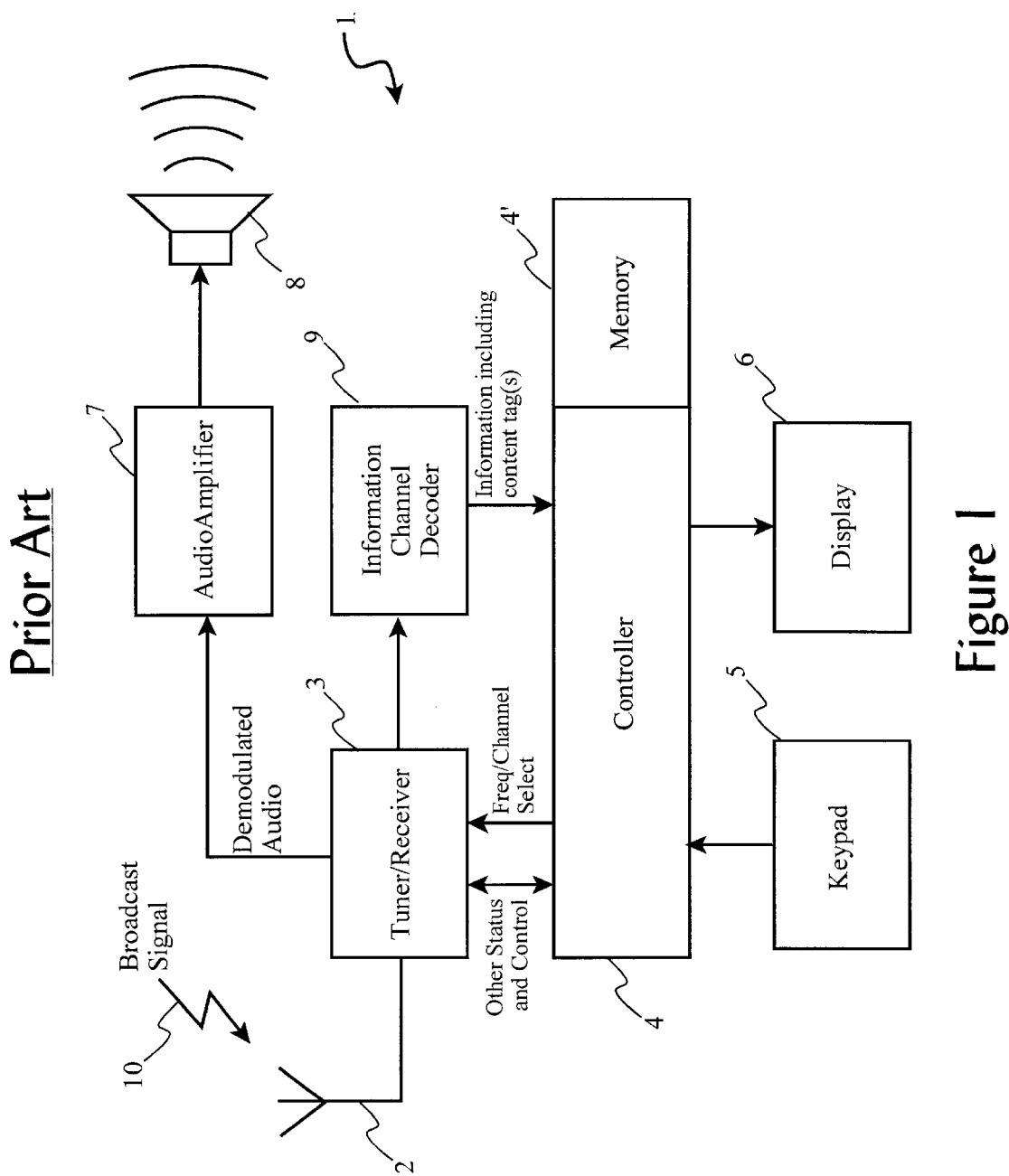
FIG. 1 shows the generalized architecture of a radio broadcast receiver.

In such a realization, the system and method may be realized through enhancements and modifications to the existing firmware which controls a radio having a general architecture as shown in FIG. 1. Chipset solutions for the tuner/receiver, information channel decoder, and audio amplifier, keypad and display are also well-known within the art.

Alternate implementations for other types of broadcast receivers are available depending on the type of broadcast to be received. For example, the system and method may be implemented as software within a web browser, Java code, or browser plug-in, for the receipt of web broadcast information. Or, it may be implemented as software or firmware changes or enhancements to the controller software within a television for the receipt of television broadcasts with preferred formats. Firmware within handheld personal digital assistants ("PDA") or wireless web phones may also be modified to realize the invention.

As such, the preferred embodiment disclosed herein is given relative to a broadcast radio receiver. However, it will be recognized by those skilled in the art that the system and method are not constrained to implementation in just a radio system, and may also be implemented in other types of broadcast receivers such as televisions, Internet broadcast receivers, and various wired and wireless receivers.

Hardware Platform

Reviewing FIG. 1, a controller (4) with memory (4') is interfaced to a keypad (5) and a display (6). The keypad (5) may include an UP or DOWN, scan or seek keys, and a number of preset station keys. The display may be one of several types which are well-known in the art, such as an alphanumeric LCD or LED display. The controller is provided with control outputs to the tuner/receiver (3), which allows the controller to select a frequency and a band for the tuner/receiver to demodulate. In return, the tuner/receiver (3) provides certain indications to the controller (4), such as station lock or station found, stereo detected, and information channel detected. The tuner/receiver has a means for receiving the signal, such as an antenna (2) or a wired connection. The tuner/receiver has an output for the decoded broadcast content, such as music or other signal. In a radio, an audio amplifier (7) is provided to receive this demodulated signal output from the tuner/receiver (3) and to drive a speaker (8).

Also in the preferred embodiment, a means for decoding the information channel in the selected broadcast signal is provided (9). This may be a device such as the Philip's SAA6579 Radio Data System Demodulator and SAA6588 RDS/RBDS preprocessor device. This information channel decoder means may be adapted or selected from available technologies depending on the type of broadcast being received. For example, if the invention is being realized to decode television broadcast format tags, an appropriate chipset or firmware module which is compatible with the television broadcast standard or protocol may be employed in its place. The remainder of the disclosure of the invention relates to methods which may be implemented as firmware or software changes for the controller.

Single Source Tuning Upon Initialization

Figure 2:
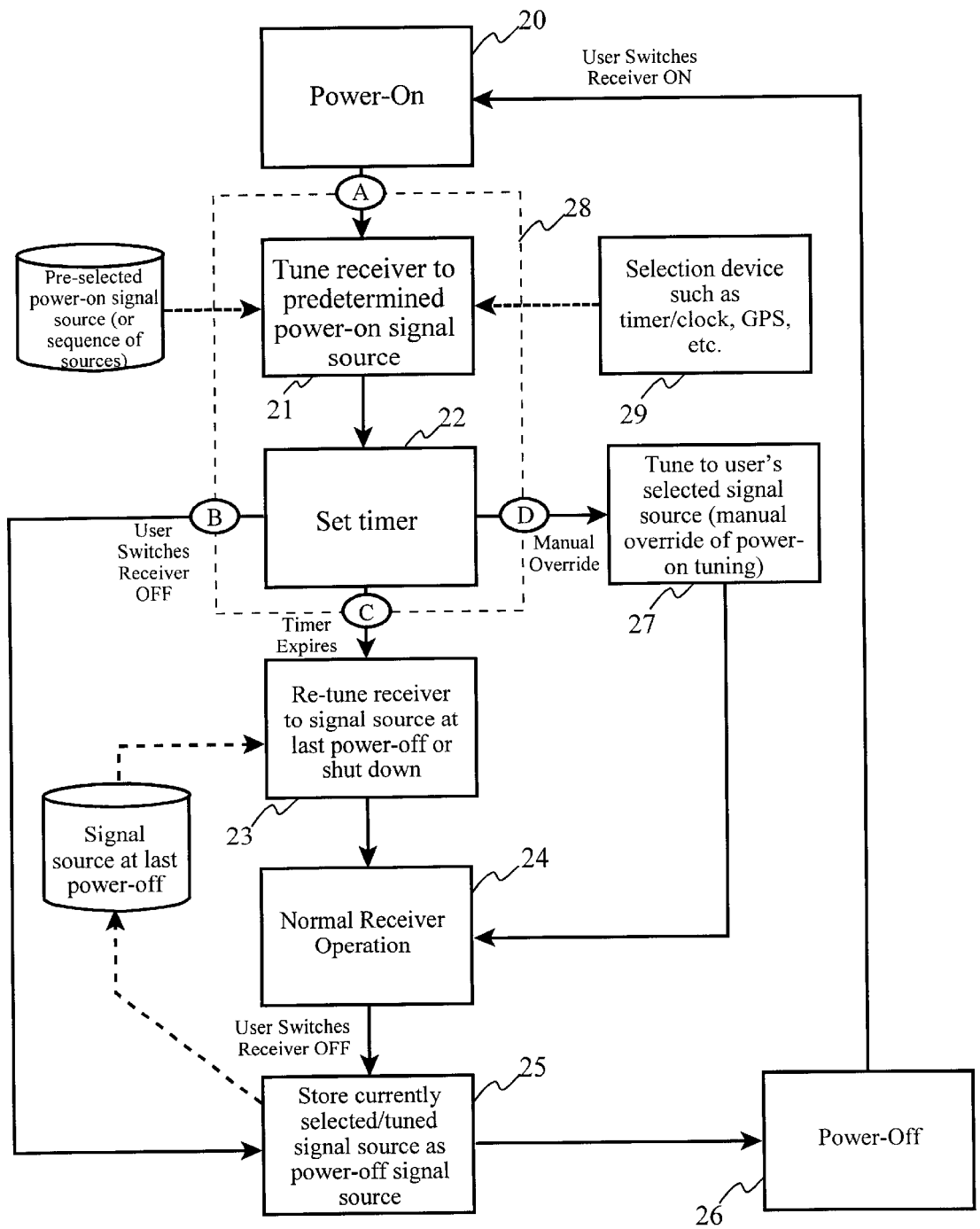
FIG. 2 presents the logical flow of the invention.

The controller (4) is provided with a firmware or software in order to control the tuner receiver (3) according to the logical flow shown in FIG. 2. The radio (1) or other broadcast receiver may be pre-configured for the preferred power-on or initialization signal sources, or it may be user-configurable, depending on the appropriate application of the receiver. For example, a radio installed in a rental car may be pre-configured by the radio manufacturer or the rental car company in order to have it automatically tune a certain signal source upon a power-on condition. Other radios which are intended for retail sales to the consumer public may be provided with a user interface option or options to configure them to automatically tune to certain stations for certain amounts of time upon power-on at the user's choice, in which case the appropriate user interfaces would be supplied with the radio. This optional embodiment of pre-configuration or user configuration may be extended to other types of receivers such as televisions in hotel rooms or televisions intended for mass retail, and web browsers for temporary executive suites in hotel rooms or web browsers for retail consumer use, etc. An analogous implementation may be made in wireless web browsers as well.

Thus, the memory (4') of the system may be programmed temporarily or permanently with a data item or data structure for the power-on signal source to be tuned upon initialization. As shown in FIG. 2, upon a power-on or initialization condition (20), the radio is automatically tuned (21) to the power-on signal source. A timer is set (22), upon the expiration of which the radio is automatically re-tuned (23) to the user's preferred signal source, or to the signal source which was tuned at the time the unit was last powered-off. This is followed by normal operation (24) of the receiver until the unit is switched off, at which time the current signal source which is tuned by the radio is stored (25). The power-off condition (26) will remain until the unit is reinitialized or powered-on (20), at which time the entire process may be repeated—automatically tuning to a preselected signal source (21) for a predetermined amount of time (22).

During the predetermined time of tuning to the power-on signal source, a user preferably may override (27) the automatically tuned signal source to receive a user's selected source such as by selecting a tune up, tune down or other radio button preset key. This cancels the power-on sequence, following which normal receiver operation would occur (24).

According to one aspect of the preferred embodiment, the radio is supplied with a timer, clock, global positioning input, or other input device (29) which allows the radio to determine one of several preselected sources to tune upon initialization. This input can be read or received and used to determine which preselected power-on source to tune (28). For example, if a car renter is scheduled to rent the car for 2 days, or to return the car at a specific time on a specific day, a clock or timer can be read which indicates initially that he has just received the car, and so a first power-on source should be tuned to provide information about how to exit the airport or car rental lot. Then, when the radio is turned ON near the predetermined return time, the radio will automatically tune to a second preselected source to provide the renter with information on how to return the car to the car rental lot. An analogous use in hotel televisions would be to provide the hotel guest with orientation information upon check-in, and to provide the guest with check-out instructions towards the end of the scheduled stay, all automatically depending on when the television was switched ON. A global positioning input could be used in a rental car to determine if the car seems to be headed back to the car rental lot or in the vicinity of the car rental lot.

According to another aspect of the preferred embodiment, during the predetermined time of tuning to the power-on source, the unit may be switched off, at which time the currently tuned source (25) would be stored as the power-off source and the system would go to power-off state (26). In such a case, the pre selected power-on source would now be equal to the stored power-off source, and would allow the user to continue to listen to the pre selected source even after the radio is re-tuned (23).

According to another aspect of the preferred embodiment, a user option is provided to allow the user to select to continue reception of the predetermined power-on signal source rather than retuning the radio automatically (23).

Signal Sources

In the preferred embodiment the signal source may be one of many available technologies such as broadcast stations, broadcast channels, stations based upon content tags as described in the related application, or prerecorded media such as tape, compact disc or non volatile memory (flash memory, NVRAM, ROM, etc.). For example, the predetermined signal source may be a broadcast station for a low-powered broadcast signal containing directions to exit an airport to assist a newly arrived visitor to exit the airport. Such information may also include directions on how to return the car, weather reports, traffic reports, and news. Alternatively, the radio could be configured to automatically play a section of signal from a tape, compact disc, or portion of memory (4') within the radio. For example, the radio may be configured to contain audio messages within memory to acquaint or orient the user with the vehicle's controls and operation. Or, a tape may be left in the tape player which contains similar information such as directions or orientation information.

According to an enhancement of the preferred embodiment, the system may be re-tuned to a preferred format broadcast according to the user's profile. For example, a rental car company could maintain a profile of each user including his preferred radio station format such as country, jazz, classical, rock, or news. The rental car company then could pre-configure the radio in the car to automatically tune to the user's preferred radio station format(s).

Sequence Tuning Upon Initialization

Figure 3:
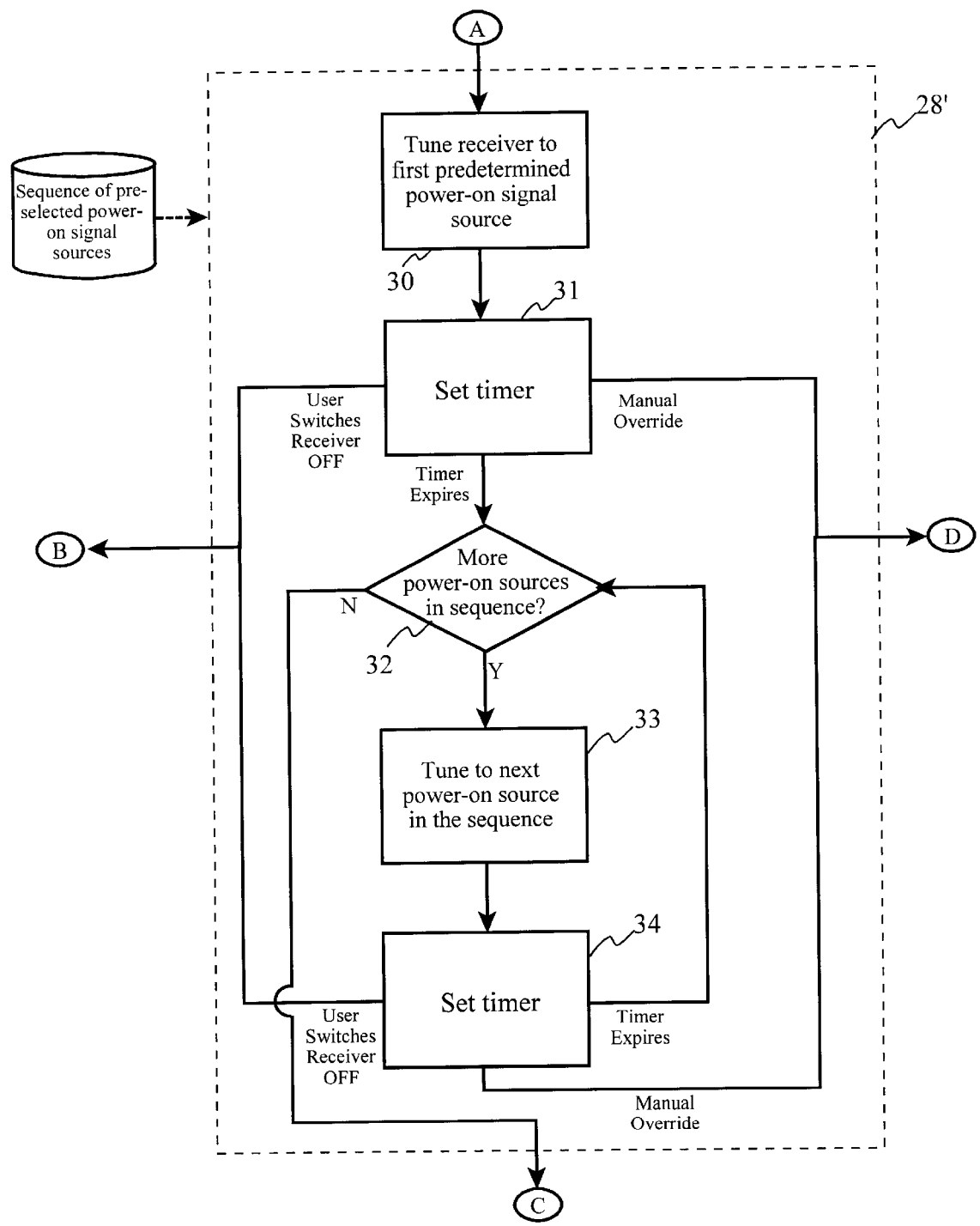
FIG. 3 depicts the logical flow of the invention in which a sequence of broadcast sources or information sources may be automatically tuned on a timed basis.

Turning to FIG. 3, an embodiment of the invention which includes sequenced source tuning upon initialization disclosed, in which the receiver will automatically tune to a sequence of predetermined signal sources on a timed or interval basis. This tuning sequence preferably replaces the tuning sequence (28) as shown in FIG. 2. Thus, the radio is first tuned to a first preselected initialization signal source (30), a timer is set (31) upon the expiration of which a check is made (32) to determine if there are additional power-on or initialization signal sources to be tuned. If there are additional signal sources to be tuned, then they are tuned (33) one at a time returning to set the timer (34) for each signal source. When all the preferred power-on signal sources have been tuned in sequence, the process of re-tuning the radio continues (23) as shown in FIG. 2.

The embodiment option of FIG. 3 allows for the user to switch off the unit, or to override the automatically tuned stations.

SUMMARY

A system and method for automatically tuning to a single signal source or to a sequence of signal sources on a timed basis upon initialization of a broadcast receiver has been disclosed. The system and method disclosed may be applied to radio receivers, as in the example embodiments, or may be applied to other types of broadcast receivers such as televisions and wired and wireless web browsers. The signal sources which are automatically tuned may be of many types including, but not limited to, television broadcast stations and channels, Internet broadcast sources, radio/television/Internet channels based upon content, and prerecorded media such as tapes, CDs, or non volatile memory.

It will be understood from the foregoing description that various modifications and changes may be made in the preferred embodiment of the present invention without departing from its spirit and scope. It is intended that this description is for purposes of illustration only and should not be construed in a limiting sense. The scope of this invention should be defined by the following claims.

What is claimed is:

1. A method of controlling a broadcast receiver, said broadcast receiver having a tuner capable of receiving a plurality of broadcast signals in a range of broadcast signals, said broadcast receiver having a first user control for setting an ON and an OFF state of the broadcast receiver, said method comprising the steps of:
  automatically tuning said broadcast receiver to at least one preselected "power on" signal source upon entering said ON state of the broadcast receiver;
  automatically re-tuning said broadcast receiver to a "power-off" signal source at a predetermined time interval after entering the power ON state such that the broadcast receiver is temporarily tuned to a "power on" signal source upon turning ON the broadcast receiver.

2. The method of claim 1 wherein said step of automatically tuning a signal source upon entering a power ON state comprises automatically tuning to a broadcast radio station.

3. The method of claim 1 wherein said step of automatically tuning a signal source upon entering a power ON state comprises automatically tuning to a broadcast television station.

4. The method of claim 1 wherein said step of automatically tuning a signal source upon entering a power ON state comprises automatically tuning to a broadcast computer network signal.

5. The method of claim 1 wherein said step of automatically tuning a signal source upon entering a power ON state comprises automatically tuning to a recorded media source.

6. The method of claim 5 wherein said step of automatically tuning a recorded media source upon entering a power ON state comprises automatically playing a digitized signal segment from a computer readable memory.

7. The method of claim 5 wherein said step of automatically tuning a recorded media source upon entering a power ON state comprises automatically playing a signal segment from a compact disk.

8. The method of claim 5 wherein said step of automatically tuning a recorded media source upon entering a power ON state comprises automatically playing a signal segment from a tape.

9. The method of claim 1 wherein said step of automatically re-tuning the broadcast receiver to a "power off" signal source at a predetermined time after entering the power ON state comprises re-tuning to a broadcast radio station.

10. The method of claim 1 wherein said step of automatically re-tuning the broadcast receiver to a "power off" signal source at a predetermined time after entering the power ON state comprises re-tuning to a broadcast television station.

11. The method of claim 1 wherein said step of automatically re-tuning the broadcast receiver to a "power off" signal source at a predetermined time after entering the power ON state comprises re-tuning to a broadcast computer network signal.

12. The method of claim 1 wherein said step of automatically tuning said broadcast receiver to at least one preselected "power on" signal source upon entering said ON state of the broadcast receiver comprises automatically tuning a plurality of preselected "power on" signal sources on a timed sequential basis.

13. A computer-readable media having program code stored therein for controlling a broadcast receiver, said broadcast receiver having a tuner capable of receiving a plurality of broadcast signals in a range of broadcast signals, said broadcast receiver having a first user control for setting an ON and an OFF state of the broadcast receiver, and having a processor capable of executing program code to control said broadcast receiver, said program code, when executed by the processor, causing the broadcast receiver to perform the steps of:
  automatically tuning said broadcast receiver to at least one preselected "power on" signal source upon entering said ON state of the broadcast receiver;
  automatically re-tuning said broadcast receiver to a "power-off" signal source at a predetermined time interval after entering the power ON state such that the broadcast receiver is temporarily tuned to a "power on" signal source upon turning ON the broadcast receiver.

14. The computer-readable media of claim 13 wherein program code for automatically tuning a signal source upon entering a power ON state comprises program code for automatically tuning to a broadcast radio station.

15. The computer-readable media of claim 13 wherein said program code for automatically tuning a signal source upon entering a power ON state comprises program code for automatically tuning to a broadcast television station.

16. The computer-readable media of claim 13 wherein said program code for automatically tuning a signal source upon entering a power ON state comprises program code for automatically tuning to a broadcast computer network signal.

17. The computer-readable media of claim 13 wherein said program code for automatically tuning a signal source upon entering a power ON state comprises program code for automatically tuning to a recorded media source.

18. The computer-readable media of claim 17 wherein said program code for automatically tuning a recorded media source upon entering a power ON state comprises program code for automatically playing a digitized signal segment from a computer readable memory.

19. The computer-readable media as set forth in claim 17 wherein said program code for automatically tuning a recorded media source upon entering a power ON state comprises program code for automatically playing a signal segment from a compact disk.

20. The computer-readable media as set forth in claim 17 wherein said program code for automatically tuning a recorded media source upon entering a power ON state comprises program code for automatically playing a signal segment from a tape.

21. The computer-readable media of claim 13 wherein said program code for automatically re-tuning the broadcast receiver to a "power off" signal source at a predetermined time after entering the power ON state comprises program code for re-tuning to a broadcast radio station.

22. The computer-readable media of claim 13 wherein said program code for automatically re-tuning the broadcast receiver to a "power off" signal source at a predetermined time after entering the power ON state comprises program code for re-tuning to a broadcast television station.

23. The computer-readable media of claim 13 wherein said program code for automatically re-tuning the broadcast receiver to a "power off" signal source at a predetermined time after entering the power ON state comprises program code for re-tuning to a broadcast computer network signal.

24. The computer-readable media of claim 13 wherein said program code for automatically tuning said broadcast receiver to at least one preselected "power on" signal source upon entering said ON state of the broadcast receiver comprises program code for automatically tuning a plurality of preselected "power on" signal sources on a timed sequential basis.

25. An automatic tuning broadcast receiver for receiving broadcast signals upon powering ON or initializing the broadcast receiver comprising:

a tuner capable of receiving a plurality of broadcast signals from broadcast signal sources;

at least one user control for said broadcast receiver, said user control causing said broadcast receiver to enter a "power on" or initialization state;

a tuner controller which, responsive to operation of the user control and entering a state of ON, causes said tuner to receive a broadcast signal from a predetermined signal source for a predetermined interval of time, following which said tuner is caused to re-tune to a "power off" signal source.

26. The automatic tuning broadcast receiver as set-forth in claim 25 wherein said tuner is adapted to receiving broadcast radio signals.

27. The automatic tuning broadcast receiver as set forth in claim 25 wherein said tuner is adapted to receiving broadcast television signals.

28. The automatic tuning broadcast receiver as set forth in claim 25 wherein said tuner is adapted to receiving broadcast computer network signals.

29. The automatic tuning broadcast receiver as set forth in claim 25 wherein said tuner controller further causes said tuner to receive a plurality of broadcast signals from predetermined signal sources in a timed sequential order, responsive to operation of the user control and entering a state of ON.

30. The automatic tuning broadcast receiver as set forth in claim 25 wherein said predetermined signal source comprises a recorded media.

31. The automatic tuning broadcast receiver as set forth in claim 30 wherein said recorded media comprises a tape.

32. The automatic tuning broadcast receiver as set forth in claim 30 wherein said recorded media comprises a compact disk.

33. The automatic tuning broadcast receiver as set forth in claim 30 wherein said recorded media comprises a computer disk.

34. The automatic tuning broadcast receiver as set forth in claim 30 wherein said recorded media comprises a computer memory.

* * * * *